United States Patent
Sargeant et al.

(10) Patent No.: US 10,676,816 B2
(45) Date of Patent: *Jun. 9, 2020

(54) HIGH-BARRIER POLYETHYLENE TEREPHTHALATE FILM

(71) Applicant: Flex Films (USA) Inc., Elizabethtown, KY (US)

(72) Inventors: Steven Sargeant, Elizabethtown, KY (US); Sudhir Naik, Noida (IN)

(73) Assignee: FLEX FILMS (USA) INC., Elizabethtown, KY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/405,585

(22) Filed: Jan. 13, 2017

(65) Prior Publication Data
US 2017/0137934 A1 May 18, 2017

Related U.S. Application Data

(63) Continuation-in-part of application No. 14/193,950, filed on Feb. 28, 2014, now Pat. No. 9,580,798.
(Continued)

(51) Int. Cl.
*B32B 27/36* (2006.01)
*B32B 27/30* (2006.01)
(Continued)

(52) U.S. Cl.
CPC .......... *C23C 16/0272* (2013.01); *B32B 27/36* (2013.01); *C08J 7/0423* (2020.01);
(Continued)

(58) Field of Classification Search
CPC ....... B32B 27/308; B32B 27/36; B32B 15/09; B32B 2307/54; B32B 2307/7244;
(Continued)

(56) References Cited

U.S. PATENT DOCUMENTS 3,775,452 A 11/1973 Karstedt
3,814,730 A 6/1974 Karstedt
(Continued)

FOREIGN PATENT DOCUMENTS

EP 0356054 A2 8/1989
EP 0449181 A2 3/1991
(Continued)

OTHER PUBLICATIONS

Polymer Bulletin, Apr. 1988, vol. 19, Issue 4, pp. 397-401.
(Continued)

*Primary Examiner* — Joanna Pleszczynska
(74) *Attorney, Agent, or Firm* — Birch, Stewart, Kolasch & Birch, LLP

(57) ABSTRACT

A high-barrier film is provided that includes a biaxially-oriented polyethylene terephthalate (PET) layer having a first side and a second side opposite the first side, a cross-linked acrylic primer layer, and a metal barrier layer. The cross-linked acrylic primer layer is adjacent to the second side of the PET layer and has a dynamic coefficient of friction (μD) to steel of less than about 0.45, while the metal barrier layer is adjacent to the first side of the PET layer. The film has a total thickness of less than or equal to about 12 μm. Processes for producing the high-barrier film are also provided.

21 Claims, 1 Drawing Sheet

Related U.S. Application Data

(60) Provisional application No. 61/840,290, filed on Jun. 27, 2013.

(51) Int. Cl.
| | | |
|---|---|---|
| *B32B 15/09* | (2006.01) | |
| *C23C 16/02* | (2006.01) | |
| *C23C 14/02* | (2006.01) | |
| *C23C 14/20* | (2006.01) | |
| *C09D 5/00* | (2006.01) | |
| *C08J 7/04* | (2020.01) | |

(52) U.S. Cl.
CPC ............ *C09D 5/002* (2013.01); *C23C 14/022* (2013.01); *C23C 14/024* (2013.01); *C23C 14/20* (2013.01); *B32B 2250/244* (2013.01); *B32B 2307/7244* (2013.01); *C08J 2367/02* (2013.01); *C08J 2433/08* (2013.01); *C08J 2433/10* (2013.01); *C08J 2433/12* (2013.01)

(58) Field of Classification Search
CPC ............... B32B 2367/00; C08J 2433/08; C08J 2433/10; C08J 2433/12
USPC .......................................................... 428/220
See application file for complete search history.

(56) References Cited

U.S. PATENT DOCUMENTS

| | | | |
|---|---|---|---|
| 3,900,617 A | 8/1975 | Grenoble | |
| 3,944,519 A | 3/1976 | Mink et al. | |
| 4,281,093 A | 7/1981 | Garden | |
| 4,386,135 A | 5/1983 | Campbell et al. | |
| 4,526,953 A | 7/1985 | Dallavia, Jr. | |
| 4,571,363 A | 2/1986 | Culbertson et al. | |
| 4,772,515 A | 9/1988 | Hara et al. | |
| 4,791,029 A | 12/1988 | Fau et al. | |
| 5,057,476 A | 10/1991 | Saruyama et al. | |
| 5,095,067 A | 3/1992 | Hara et al. | |
| 5,288,830 A | 2/1994 | Itou et al. | |
| 5,370,930 A | 12/1994 | Ito | |
| 5,427,235 A | 6/1995 | Powell et al. | |
| 5,432,006 A | 7/1995 | Kessel et al. | |
| 5,468,824 A | 11/1995 | Togashi et al. | |
| 5,476,707 A * | 12/1995 | Fiard ......................... | C08J 5/18 427/127 |
| 5,487,940 A | 1/1996 | Bianchini et al. | |
| 5,672,428 A | 9/1997 | Muschelweicz et al. | |
| 5,708,075 A | 1/1998 | Chung et al. | |
| 5,728,339 A | 3/1998 | Farrar | |
| 5,942,591 A | 8/1999 | Itoh et al. | |
| 5,965,226 A | 10/1999 | Muschelewicz et al. | |
| 6,037,394 A * | 3/2000 | Sato ........................... | C08J 7/04 524/261 |
| 6,106,950 A | 8/2000 | Searle et al. | |
| 6,200,511 B1 | 3/2001 | Peiffer et al. | |
| 6,410,134 B1 | 6/2002 | Park et al. | |
| 6,696,161 B2 | 2/2004 | Irifune et al. | |
| 6,737,119 B1 | 5/2004 | Kim et al. | |
| 7,105,223 B2 | 9/2006 | Kleisch et al. | |
| 7,592,412 B2 | 9/2009 | Cray et al. | |
| 8,236,399 B2 | 8/2012 | Chicarella et al. | |
| 8,399,080 B2 | 3/2013 | Chicarella et al. | |
| 2004/0076818 A1 | 4/2004 | Janssens | |
| 2004/0146724 A1 | 7/2004 | Pfeiffer | |
| 2005/0100723 A1* | 5/2005 | Tanaka ..................... | B32B 27/08 428/220 |
| 2006/0093758 A1* | 5/2006 | Sakakura ............... | H05B 33/04 428/1.6 |
| 2006/0159912 A1 | 7/2006 | Haldeman | |
| 2008/0311333 A1 | 12/2008 | Yoon et al. | |
| 2009/0022919 A1 | 1/2009 | Chicarella et al. | |
| 2010/0112255 A1 | 5/2010 | Fayet et al. | |
| 2011/0059322 A1 | 3/2011 | Hayashizaki | |
| 2011/0209901 A1* | 9/2011 | MacDonald ............... | C08J 7/04 174/254 |
| 2012/0148785 A1 | 6/2012 | Hsu et al. | |
| 2012/0288693 A1* | 11/2012 | Stanley ..................... | B32B 7/12 428/213 |
| 2013/0089734 A1* | 4/2013 | Nakamura ............ | B32B 15/082 428/339 |
| 2013/0115423 A1* | 5/2013 | Ii .............................. | B05D 5/00 428/141 |
| 2013/0122314 A1 | 5/2013 | Ou | |

FOREIGN PATENT DOCUMENTS

| | | |
|---|---|---|
| EP | 1697444 B1 | 6/2013 |
| WO | 2012091451 A2 | 7/2012 |

OTHER PUBLICATIONS

"LumLife MA11 technical data sheet", Jan. 1, 2009, available at http://www.toraytpa.com/sites/default/files/data_sheets/LUM%20PS-0169%20MA11%20Datasheet%20Metric.pdf, downloaded Oct. 21, 2014.
EPO, Extended European Search Report, issued in corresponding European application No. 14158059.7, dated Oct. 14, 2014.
ISA/KR, International Search Report and Written Opinion issued in related international application No. PCT/US2014/044568, dated Oct. 13, 2014.
European Patent Office, European Office Action issued in corresponding Application No. 14148059.7, dated Oct. 27, 2016.
"Standard Test Method for Tensile Properties of Thin Plastic Sheeting," ASTM International Standard, ASTM International, US, vol. D882-02, Jan. 1, 2002, pp. 164-173, XP009079608.
"Standard Test Methods for Determination of Gel Content and Swell Ratio of Crosslinked Ethylene Plastics," ASTM D2765, Jan. 1, 2011, pp. 691-698, XP009190444.
European Patent Office, Examination Report issued in corresponding Application No. 14158059.7, dated Aug. 22, 2017.
Anonymous: "Friction," Wikipedia, the free encyclopedia, Mar. 8, 2017 (Mar. 8, 2017), pp. 1-10. Retrieved from the Internet: URL:https://en.wikipedia.org/wiki/Friction.
Bishop, Charles A., et al. "Metallizing Technical Reference," May 1, 2012 (May 1, 2012), pp. 1-229, XP055398909, Retrieved from the Internet: URL:http://www.aimcal.org/uploads/4/6/6/9/46695933/aimcal-metallizing-technical-reference-5thed.pdf.
Blau, Peter J., et al. "The significance and use of the friction coefficient," Tribology International, Jan. 1, 2001 (Jan. 1, 2001), pp. 585-591, XP055398896, DOI: 10.1016/S0301-679X(01)00050-0. Retrieved from the Internet: URL: http://www.sciencedirect.com/science/article/pii/S0301679X01000500/pdfft?md5=6b595cf3890464940a1d4d67b60926cd&pid=1-s2.0-S0301679X01000500-main.pdf.
"ASTM D1894 Standard Test Method for Static and Kinetic Coefficients of Friction of Plastic Film and Sheeting", ASTM D1894-14, vol. D1894, Jan. 1, 2014, pp. 479-485, XP009195247.
"Plastics—Films and sheeting—Determination of the coefficients of friction", ISO 8295, 2nd Ed., Oct. 1, 1995, pp. 1-8, XP055279465, Retrieved from the internet: URL:http://acer-p/common/downloadOriginal.do?dataId=&packageId=E11154E7B0716FP1&totalPages=1.
European Office Action for European Application No. 14158059-7, dated Aug. 6, 2018.

* cited by examiner

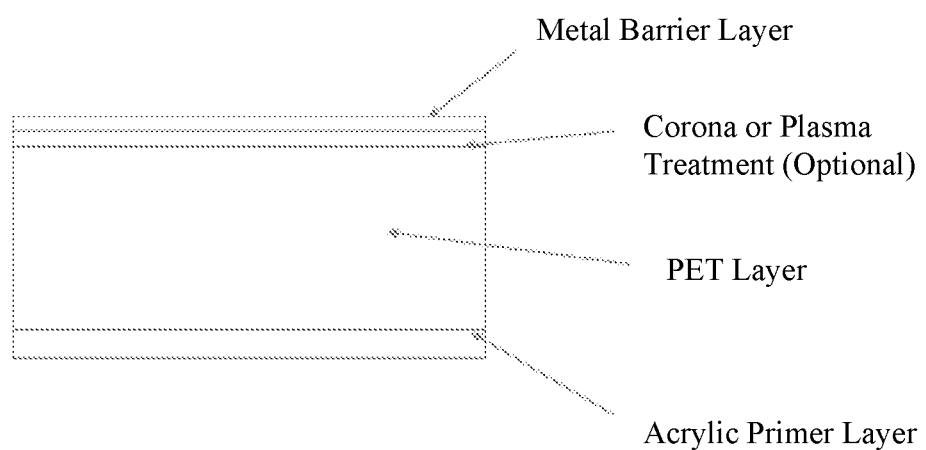

HIGH-BARRIER POLYETHYLENE TEREPHTHALATE FILM

RELATED APPLICATIONS

This application is a Continuation-In-Part application of U.S. application Ser. No. 14/193,950, filed Feb. 28, 2014, which claims priority from U.S. Provisional Application Ser. No. 61/840,290, filed Jun. 27, 2013, the entire disclosures of which are incorporated herein by this reference.

TECHNICAL FIELD

The presently-disclosed subject matter relates to high-barrier polyethylene terephthalate films and processes for producing the same. In particular, the presently-disclosed subject matter relates to high-barrier polyethylene terephthalate films having a biaxially-oriented polyethylene terephthalate layer, a cross-linked acrylic primer layer, and a metal barrier layer.

BACKGROUND

It is appreciated that the density of the amorphous phase within biaxially-oriented polyethylene terephthalate (PET) film is directly related to the overall gas barrier properties. It is also appreciated that the amorphous content of any PET film is the weight fraction of material that is not crystallized within the biaxial orientation process, and that the densification of the amorphous phase implies that the mass per unit volume of non-crystalline material is increased (see, e.g., Polymer Bulletin, April 1988, Volume 19, Issue 4, pp. 397-401, which is incorporated herein by this reference in its entirety). In this regard, crystallinity and amorphous phase densification are both parameters that can be modified on a conventional biaxially-oriented stretching machine through stretch ratio conditions, the temperature of stretching, and the subsequent heat-setting of the film. Moreover, such densification is known to increase with the orientation of PET film.

In producing high-barrier PET films, however, although the use of an aluminum vacuum deposition process to produce a barrier layer in the film is common, the use of such a process does not guarantee the suitability of the resulting films for very high-barrier requirements due to the potential for defects. Indeed, defect population and type of defect become limiting factors for very high-barrier applications making use of vacuum-deposited metal surfaces, such as what may be found in the high-barrier films that are often necessary for extending shelf-life in food and electronics packaging, tobacco, medical packaging, and other industrial uses such as the fabrication of balloons.

Vacuum metallizing thin films at the high optical densities, often greater than 2.7 OD, needed for very high gas barrier applications can result in thermal distortions to the films during the process. Indeed, it is typical for these distortion problems to result in heat lanes or tracks or, in other words, areas of localized shrinkage within the PET film structure that are due to a high heat load that is not dissipated quickly. Metal adhesion, barrier properties, and appearance are then all poor within the film areas that heat lanes develop.

In order to combat the defects caused by heat lanes, it is common to use a gas wedge in the vacuum metallizing process. This process consists of injecting a gas between the moving PET web and the chill roll in the vacuum metallizing process. The increased thermal transfer from chill roll to film is often enough to reduce heat lanes in metallized films to an acceptable level. However, in the case of very thin films (less than about 10 µm), the ability of the film to traverse the chill roll assembly without sticking, wrinkling, or distorting is a serious issue. Additionally, in such situations, the use of high tensions on the thin film to keep the film flat on the chill roll is practically impossible due to the tensile limitations of the film under a heat load. One solution to this problem is to run the film at reduced speeds in the metallizing chamber. However, the significant commercial cost of running film at reduced speeds makes that approach unrealistic.

Accordingly, there remains a need in the art to produce a thin, high-barrier, and high-adhesion PET film at commercially-acceptable line speeds. Such films and processes are particularly desirable and beneficial for a range of applications in food and consumer packaging and in the fabrication of industrial commodities.

SUMMARY

The presently-disclosed subject matter meets some or all of the above-identified needs, as will become evident to those of ordinary skill in the art after a study of information provided in this document.

This summary describes several embodiments of the presently-disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this summary or not. To avoid excessive repetition, this summary does not list or suggest all possible combinations of such features.

The presently-disclosed subject matter includes high-barrier polyethylene terephthalate films and processes for producing the same. In particular, the presently-disclosed subject matter includes high-barrier polyethylene terephthalate films having a biaxially-oriented polyethylene terephthalate layer, a cross-linked acrylic primer layer, and a metal barrier layer.

In some embodiments of the presently-disclosed subject matter, a high-barrier film is provided that comprises a biaxially-oriented polyethylene terephthalate (PET) layer having a first side and a second side opposite the first side, a cross-linked acrylic primer layer that is adjacent to the second side of the PET layer and that has a dynamic coefficient of friction (µD) to steel of less than about 0.45, and a metal barrier layer that is adjacent to the first side of the PET layer. In some embodiments, such a film has a total thickness of less than or equal to about 12 µm, and a tensile strength of at least about 2500 kg/cm$^2$ in both a transverse direction and a longitudinal direction of the film. In some embodiments, such a film has a total thickness of less than or equal to about 12 µm, and a surface roughness of less than about 5 nm. In some embodiments, such a film has a total thickness of less than or equal to about 12 µm, and an oxygen ($O_2$) transmission rate of less than about 1.0 cc/m$^2$/day. In some embodiments, the film has an optical density of greater than about 2.7.

With respect to the cross-linked acrylic primer layer included in the high-barrier films, in some embodiments, the cross-linked acrylic primer layer comprises an acrylate selected from the group consisting of methylmethacrylate, butylacrylate, methacrylic acid, methyl acrylate, acrylic acid, and hydroxyethylmethacrylate, and combinations thereof. To produce a sufficiently hard acrylic primer layer, the acrylic primer layer can further include a cross-linking agent selected from the group consisting of melamines, dicyclocarbodiimides, epoxies, and aldehydes. In this regard, in some embodiments, the cross-linked acrylic primer layer has a cross-linking density of about 10% to about 40%. In some embodiments, the cross-linked acrylic primer layer has a dynamic coefficient of friction ($\mu D$) to steel of less than about 0.45 or less than about 0.20 when heated to 150° C. Such cross-linked acrylic primer layers can have a thickness of less than about 0.3 µm, less than about 0.15 µm, or less than about 0.05 µm.

The metal barrier layers of the presently-described films are typically comprised of either aluminum or aluminum oxide. In certain embodiments, the metal barrier layer is comprised of aluminum oxide to produce a film having an oxygen transmission rate of less than about 1.5 cc/day/m$^2$. In some embodiments, a high-barrier film has an amount of adhesion of the metal barrier layer to the PET layer of greater than about 150 g/inch.

Further provided by the presently-disclosed subject matter are processes for producing a high-barrier film. In some embodiments, a process for producing a high-barrier film is provided wherein a biaxially-oriented PET layer having a first side and a second side opposite the first side is first produced by melting an amount of PET pellets to form an initial PET layer. That initial PET layer is then stretched in a longitudinal direction, and a second side of the PET layer is subsequently in-line coated with a cross-linked acrylic primer to produce a cross-linked acrylic primer layer having a dynamic coefficient of friction ($\mu D$) to steel of less than about 0.45. After coating the second side of the PET layer with the cross-linked acrylic primer, the PET layer is then stretched in a transverse direction. To complete the film, the first side of the PET layer is then corona treated and vacuum metallized to produce a film having a desired optical density. In some embodiments, the film is vacuum metallized to an optical density of greater than about 2.7.

Further features and advantages of the presently-disclosed subject matter will become evident to those of ordinary skill in the art after a study of the description, figures, and non-limiting examples in this document.

BRIEF DESCRIPTION OF THE DRAWINGS

FIG. 1 is a schematic diagram of an exemplary high-barrier PET film made in accordance with the presently-disclosed subject matter.

DESCRIPTION OF EXEMPLARY EMBODIMENTS

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

Unless defined otherwise, all technical and scientific terms used herein have the same meaning as commonly understood by one of ordinary skill in the art to which the presently-disclosed subject matter belongs. Although any methods, devices, and materials similar or equivalent to those described herein can be used in the practice or testing of the presently-disclosed subject matter, representative methods, devices, and materials are now described.

Following long-standing patent law convention, the terms "a," "an," and "the" refer to "one or more" when used in this application, including the claims. Moreover, unless otherwise indicated, all numbers expressing quantities of ingredients, properties such as reaction conditions, and so forth used in the specification and claims are to be understood as being modified in all instances by the term "about." Accordingly, unless indicated to the contrary, the numerical parameters set forth in this specification and claims are approximations that can vary depending upon the desired properties sought to be obtained by the presently-disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method. Additionally, as used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

The presently-disclosed subject matter includes high-barrier polyethylene terephthalate films and processes for producing the same. In particular, the presently-disclosed subject matter includes high-barrier polyethylene terephthalate films having a biaxially-oriented polyethylene terephthalate layer, a cross-linked acrylic primer layer, and a metal barrier layer.

As shown in FIG. 1, in some embodiments of the presently-disclosed subject matter, a high-barrier film is provided that comprises a biaxially-oriented polyethylene terephthalate (PET) layer having a first side and a second side opposite the first side; a cross-linked acrylic primer layer positioned adjacent to the second side of the PET layer and having a dynamic coefficient of friction ($\mu D$) of less than about 0.45; and a metal barrier layer positioned adjacent to first side of the cross-linked acrylic primer layer. In some embodiments, the total thickness of the film having the foregoing layers is less than or equal to about 12 µm.

The PET layers included in the high-barrier films can comprise PET homopolymers, where the PET layer consists of only PET, or can comprise PET copolymers, where the PET layer includes PET and one or more additional co-monomers. Additional co-monomers that can be used in this regard include diethylene glycol, propylene glycol, neopentyl glycol and polyalkylene glycols, 1,4-butane diol, 1,3-propane diol, and dicarboxylic acids such as adipic acid, sebacic acid, malonic acid, succinic acid, isophthalic acid, and 2,6-napthalenedicarboxylic acid.

Regardless of whether the PET layer includes PET homopolymers or copolymers, the PET layer included in the films of the presently-disclosed subject matter is generally prepared by processes known to those of ordinary skill in the art including the use of conventional sequential biaxial orientation machines having a single screw mainline extrusion train and a twin screw sub-extrusion process. In this regard, in some embodiments, standard PET pellets having a desired intrinsic viscosity can be fed into the main extrusion line, while a blend of standard PET pellets and silica-filled PET pellets can be fed in to the sub-extrusion process, such that the materials can be melted separately and then laminated together in a feed-block to produce a desired molten structure (e.g., an A/B/A molten structure) in an extrusion die. The laminated PET material or layer emerging from the extrusion die can then quenched on a chilled casting drum to produce a thick, amorphous film structure. The PET layer is then preferably stretched about 2 to about 5 times in the machine, or longitudinal, direction and, after the acrylic primer coating process described below, about 2 to about 5 times in the transverse direction, followed by heat crystallization. In some embodiments, after stretching the PET layer in the longitudinal and transverse direction and crystallization, a layer of PET material is obtained having a tensile strength of at least about 2500 kg/cm$^2$ in both the transverse and the longitudinal direction of the film, and having dimensions that are about 3.4 times those originally found in the PET layer in both the longitudinal and transverse direction. In some embodiments, the resulting PET layer has a total thickness of about 6 µm to about 12 µm, including, in some embodiments, PET layers having a total thickness of about 6 µm, about 7 µm, about 8 µm, about 9 µm, about 10 µm, about 11 µm, and about 12 µm.

With respect to the acrylic primer layer included in the high-barrier films of the presently-disclosed subject matter, the acrylic primer layer is highly cross-linked and capable of providing a low coefficient of friction (COF) to metal to increase the contact of film to metal and to facilitate the vacuum metallizing process described below. In some embodiments, the dynamic COF of the acrylic layer of the film to the metal is about 0.15 µD to about 0.45 µD when heated to 150° C. In some embodiments, the dynamic COF of the acrylic layer of the film to the metal is about 0.15 µD, about 0.20 µD, about 0.25 µD, about 0.30 µD, about 0.35 µD, about 0.40 µD, or about 0.45 µD. In some embodiments, the dynamic COF of the acrylic layer of the film to the metal is less than about 0.45 µD when heated to 150° C. In some embodiments, the COF of the acrylic layer of the film to the metal is less than about 0.20 µD when heated to 150° C.

In some embodiments, to produce an acrylic primer layer having such properties, the acrylic primer layer can be comprised of an acrylic resin that adheres well to the PET layer. Such acrylic resins can be selected from resins having a monomer component such as, for example, an alkyl acrylate, an alkyl methacrylate, (examples of such alkyl groups include a methyl group, an ethyl group, an n-propyl group, an isopropyl group, an n-butyl group, an isobutyl group, a t-butyl group, a 2-ethylhexyl group, a lauryl group, a stearyl group, a cyclohexyl group, a phenyl group, a benzyl group, a phenylethyl group and the like), a monomer having a hydroxyl group such as 2-hydroxyethyl acrylate, 2-hydroxyethyl methacrylate, 2-hydroxypropyl acrylate, 2-hydroxypropyl methacrylate or the like, a monomer having an amide group such as acrylamide, methacrylamide, N-methyl acrylamide, N-methyl methacrylamide, N-methylol acrylamide, N-methylol methacrylamide, N,N-dimethylol acrylamide, N-methoxymethyl acrylamide, N-methoxymethyl-methacrylamide, N-phenyl acrylamide or the like, a monomer having an amino group such as N,N-diethylamino ethyl acrylate, N,N-diethylamino ethyl methacrylate or the like, a monomer having an epoxy group such as glycidyl acrylate, glycidyl methacrylate or the like, a monomer having a carboxylic acid or a salt thereof such as acrylic acid, methacrylic acid or a salt thereof (an alkali metal salt, an alkali earth metal salt, an ammonium salt or the like) and the like whereupon one or more types of such monomer components are copolymerized. In some embodiments, the acrylic primer is comprised of a copolymer of methyl methacrylate that further includes methacrylic acid and methacrylonitrile. In some embodiments, the acrylic primer is comprised of a co-polymer of methylmethacrylate, butylacrylate, methacrylic acid, methyl acrylate, acrylic acid, and hydroxyethylmethacrylate, alone or in combination with other monomers, as such a combination of monomers has been observed to produce an acrylic primer layer having sufficient hardness and COF values as well as a sufficient ability to adhere to down-stream sealants including, but not limited to, polyethylene, ethylene vinyl acetate, ethylene methyl acrylate, and copolymers and terpolymers thereof.

In addition to the acrylic components of the acrylic primer layer, one or more cross-linking agents are typically also included in the acrylic primer layer to harden the acrylic primer layer, to reinforce the bonding between the various layers of the high-barrier film, and to also provide a highly cross-linked layer capable of providing increased thermal resistance when the film is subsequently vacuum-metallized. Exemplary cross-linking agents that can be used with the acrylic components include, but are not limited to, melamine-based cross-linkers, epoxy-based cross-linkers, aziridine-based cross-linkers, epoxyamide compounds, titanate-based coupling agents (e.g., titanium chelate), oxazoline-based cross-linkers, isocyanate-based cross-linkers, methylolurea or alkylolurea-based cross-linkers, aldehyde-based cross-linkers, and acrylamide-based cross-linkers. In some embodiments, the cross-linking agent is selected from melamine, epoxy-based cross-linkers, and aldehyde-based cross-linkers.

In some embodiments, the cross-linking agents are included in the acrylic primer layer to produce a cross-linked acrylic primer layer having a cross-linking density of about 10%, about 15%, about 20%, about 25%, about 30%, or about 40%. In some embodiments, the cross-linking agents are included in the acrylic primer layer to produce a cross-linked acrylic primer layer having a cross-linking density of greater than about 10%.

The acrylic primer layer can be applied to the second side of the PET layer by a number of methods, including application of the acrylic primer in a dispersion or solution of water, and by an application method such as gravure coating, meyer rod coating, slot die, knife over roll, or any variation of roll coating. In one preferred embodiment, the acrylic primer layer is applied by inline coating, whereby the acrylic primer layer is applied to the PET layer as it is being produced. More specifically, and as described above, the acrylic primer layer is preferably applied to the second side of the PET layer by inline coating immediately after stretching the PET layer in the longitudinal direction. In some embodiments, the thickness of the acrylic primer layer that is applied to the second side of the PET layer is about 0.3 µm, about 0.25 µm, about 0.2 µm, about 0.15 µm, about 0.10 µm, or about 0.05 µm.

Once the acrylic primer layer has been applied to the PET layer, an electrical treatment, such as a plasma or corona treatment, can then be optionally used to change the surface energy on the first side of the PET layer and thereby allow for increased bond strength between the PET layer and the metal barrier layer upon its deposition. In some embodiments, the layers can be corona treated to a dyne value of about 50 to about 60 dynes (e.g., 56 dynes), as such dyne values have been observed to allow sufficient bonding between the metal barrier layer and the PET film. Typically, the bonding strength or, in other words, the strength of the metal adhesion to the PET film, is greater than 150 g/in and, preferably, greater than 250 g/in as measured by first laminating a strip of an ionomer resin (e.g., Surly, DuPont de Nemours and Company, Wilmington, Del.) to the deposited metal layer on the film and then removing the metal by pulling on the resulting film-ionomer laminate in a tensile tester according to Association of International Metallizers, Coaters, and Laminators (AIMCAL) guidelines for measuring metal adhesion to films.

Turning now to the application of the metal barrier layer, the term "metal barrier layer" is used herein to refer to both traditional metallized layers, such as aluminum layers, as well as more ceramic-like layers, such as layers comprised of silicon oxide and/or aluminum oxide. Such metal barrier layers can be applied adjacent to the first side of the PET layer using a number of deposition methods including, but not limited to, physical vapor deposition or chemical vapor deposition. In one preferred embodiment, the metal barrier layer is an aluminum oxide layer that is applied by physical vapor deposition in a vacuum in situ, where aluminum is heated under low pressure conditions (e.g., less than about $1.0 \times 10^{-3}$ mbar) in the presence oxygen gas to allow the aluminum to form a vapor at lower temperature and then be applied to the film as a clear barrier layer of aluminum oxide without causing thermal damage to the other layers during its application. In some embodiments, an amount of aluminum oxide is applied to the first side of the PET sufficient to provide an oxygen transmission rate of less than 1.5 cc/m$^2$/day In some embodiments, the oxygen transmission rate of the presently-disclosed films is less than about 1.0 cc/m$^2$/day, such as, in certain embodiments, about 0.5 cc/m$^2$/day.

In another preferred embodiment of the presently-described high-barrier films, the metal barrier layer can be in the form of an aluminum layer that can be formed by heating an aluminum wire fed to the surface of an electrically heated plate or by heating an ingot of aluminum within a crucible, and then condensing the resulting aluminum vapor on the first side of the PET film. In this regard, in such embodiments, the films are typically vacuum metallized to an optical density of greater than about 2.7 to provide a film capable of providing a high gas barrier. However, regardless of the particular type of metal barrier layer that is applied, by including the acrylic primer layer having a low COF to metal, the acrylic layer allows the film to continually be in sufficient contact with a chill roll to ensure that no thermal defects are included on the film as the high-barrier metal layer is produced.

As a further refinement to the presently-described high-barrier films, in some embodiments, a high-barrier film is provided having a surface roughness, Sra, (i.e., a roughness of the surface to which the metallized layer is applied) of less than about 5 nm including, in some embodiments, less than about 4.5 nm, less than about 4.0 nm, less than about 3.5 nm, less than about 3.0 nm, less than about 2.5 nm, less than about 2.0 nm, less than about 1.5 nm, and less than about 1.0 nm. Measurement of such surface roughness (Sra) values can be made by using any number of surface metrology methods known to those skilled in the art, including, but not limited to, the use of laser profiling and needle stylus methods.

The presently-disclosed subject matter is further illustrated by the following specific but non-limiting examples.

EXAMPLES

Example 1

High-Barrier, Acrylic-Coated, Metallized Polyethylene Terephthalate (PET) Film

PET film was prepared in a conventional sequential biaxial orientation machine. The machine consisted of a single screw mainline extrusion train and a twin screw sub extrusion process. Briefly, PET pellets of an intrinsic viscosity (IV) of 0.62 were fed into the main extrusion train at a rate of 650 Kg/hr. Into the sub-extrusion process, a blend of 0.62 IV PET pellets (75%) and silica filled PET pellets (25%) were fed into the system. The amount of silica used was optimized to produce a COF of less than 0.45 μD at the end of the film making process. These materials were then separately melted and laminated together in a feed-block to produce an A/B/A molten structure in the extrusion die.

The molten laminated PET material that emerged from the extrusion die was subsequently quenched on a chilled casting drum to produce a thick, amorphous film structure. Subsequently, this film was stretched in the machine, or lengthwise, direction through a heated roller assembly. The ratio of this stretching was varied. After longitudinal stretching, the film was coated with a low COF acrylic coating, and was then stretched in the transverse direction to obtain a sheet having a dimension roughly 3.4 times the original dimension of the film in both the longitudinal and transverse direction. The crystallizing temperatures were set to produce a film with a minimum tensile strength of 2500 kg/cm$^2$ in both the machine direction and transverse direction. The reverse side of this film was then corona treated in a film making machine to a dyne value of 56 dynes.

Subsequently, this film was vacuum metallized with aluminum to an OD of 2.8. In this process, the low COF acrylic coating was noted to allow the film to lay flat on the chill roll, and the film subsequently produced (see, e.g., FIG. 1) had no heat lanes or other thermal related defects.

Example 2

Metallized Polyethylene Terephthalate (PET) Film

A second 9 μm PET film was prepared as described above in Example 1. However, in the second film, the film was stretched in the machine direction only by a factor of 3.0. Additionally, the second film was not coated and was side-ways drawn and heat-set to produce a film with tensile properties of roughly 2000 kg/cm$^2$ in both the longitudinal and transverse directions. Subsequent to stretching, the second film was vacuum metallized to an OD of 2.8 and, in that process, a small amount of heat-lanes were noted.

Example 3

Comparison of Films

To compare the acrylic-coated film from Example 1 to the uncoated, control film from Example 2, both films were processed in an additional step. Briefly, each film was slit into narrow rolls and were placed into an off-line extrusion coater. In this process, each film was unwound and the non-metal side was primed with a polyethylene primer and then extrusion coated with a blend of polyethylene (PE) and low-density polyethylene (LDPE). The laminated film structures were then fabricated into balloon shapes. Helium was used to inflate the balloons and the relative lifetime of the balloons was measured as shown in Table 1 below.

TABLE 1

|           | Day 1   | Day 2    | Day 3    | Day 4    | Day 5    | Day 6    | Day 7    | Day 8    | Day 9    |
|-----------|---------|----------|----------|----------|----------|----------|----------|----------|----------|
| Example 1 | Firm    | Firm     | Firm     | Firm     | Firm     | Firm     | Firm     | Firm     | Firm     |
| Example 1 | Firm    | Firm     | Firm     | Firm     | Firm     | Firm     | Firm     | Spongy   | Spongy   |
| Example 1 | Firm    | Firm     | Firm     | Firm     | Firm     | Firm     | Firm     | Spongy   | Spongy   |
| Control 1 | Firm    | Firm     | Firm     | Spongy   | Spongy   | Spongy   | Deflated | Deflated | Deflated |
| Control 1 | Spongy  | Deflated | Deflated | Deflated | Deflated | Deflated | Deflated | Deflated | Deflated |

Lifetime was evaluated by assessing the firmness of inflated balloons. From a commercial standpoint, firmness of the balloon is believed to be important because when sufficient helium gas has diffused out of a particular balloon and the shape changes and the balloon begins to feel spongy, the balloons have no or little commercial value.

As shown in Table 1, the use of the low COF acrylic-coated PET film provided for a much better lifetime than conventional films. Although not wanting to be bound by any particular theory, it was believed that the low COF of the acrylic-coated films provided for more intimate contact between the PET film and the chill roll in the vacuum metallizing chamber. Additionally, it was believed that the high tensile properties of the acrylic-coated film allowed for higher tension in the vacuum metallizing process, which further increased the contact between the chill roll and the film. Such enhanced contact between film and chill roll increased the heat transfer upon subsequent high metal density deposition.

Example 4

Evaluation of Additional Films

To evaluate the properties of additional acrylic-coated films, a 12 μm biaxially-oriented PET film was produced using the methodology as described above in Example 1. The 12 μm film was also coated with a low COF acrylic coating and was vacuum metallized. Subsequent to production, the 12 μm PET film was then compared to a 9 μm low COF acrylic-coated, vacuum metallized film produced as described in Example 1 as well as to a metallized 12 μm film having a copolyester or a copolyester/acrylic hybrid coating.

As shown in Table 2, and similar to the 9 μm film, the 12 μm low COF acrylic-coated, vacuum metallized film exhibited a lower surface roughness (Sra) as measured by standard laser profiling techniques. Moreover, the 12 μm low COF acrylic-coated, vacuum metallized film showed the highest barrier results as measured by an OX-TRAN® Model 1/50 according to the manufacturer's instructions (MOCON, Inc., Minneapolis, Minn.). Again, and although not wanting to be bound by any particular theory, it was believed that the low COF of the 12 μm acrylic-coated films provided for more intimate contact between the PET film and the chill roll in the vacuum metallizing chamber, which, in turn, led to an increased smoothness of the films and a higher barrier as measured by oxygen transmission.

TABLE 2

|                       | PET Film Thickness (μm) | Surface Coating          | Film to Steel COF (μD) | Metal OD | Sra-Surface Layer | $O_2$ Transmission         |
|-----------------------|-------------------------|--------------------------|------------------------|----------|-------------------|----------------------------|
| New Example           | 12                      | Cross-linked acrylic     | 0.43                   | 2.9      | 1.4 nm            | 0.23 cc/m²/day             |
| New Example           | 12                      | Cross-linked acrylic     | 0.43                   | (AlOx)   | 1.4 nm            | 0.50 cc/m²/day             |
| New Example           | 9                       | Cross-linked acrylic     | 0.43                   | (AlOx)   | 1.4 nm            | 0.55 cc/m²/day             |
| Comparative Example 1 | 12                      | Copolyester              | 0.63                   | 2.55     | 26 nm             | 1.1 cc/m²/day              |
| Comparative Example 2 | 12                      | Copolyester/Acrylic Hybrid | 0.55                 | 2.8      | 17 nm             | 0.65 cc/m²/day             |

Throughout this document, various references are mentioned. All such references are incorporated herein by reference, including the references set forth in the following list:

REFERENCES

1. U.S. Pat. No. 5,427,235, to Powell, et al., issued Jun. 27, 1995, and entitled "High Barrier Packages for Smoking Articles and Other Products."
2. U.S. Pat. No. 6,200,511, to Peiffer, et al., issued Mar. 13, 2001, and entitled "Polyester Film Having a High Oxygen Barrier and Improved Adhesion to Metal Layers its Use and Process for Its Production."
3. U.S. Pat. No. 8,236,399, to Chicarella, et al., issued Aug. 7, 2012, and entitled "Lighter than Air Balloon Made from Biaxially Oriented Polyester Film."
4. U.S. Pat. No. 8,399,080, to Chicarella, et al., issued Mar. 19, 2013, and entitled "Lighter than Air Balloon Made from Biaxially Oriented Polyester Film."

It will be understood that various details of the presently disclosed subject matter can be changed without departing from the scope of the subject matter disclosed herein. Furthermore, the foregoing description is for the purpose of illustration only, and not for the purpose of limitation.

What is claimed is:

1. A high-barrier film, comprising:
   a biaxially-oriented polyethylene terephthalate (PET) layer having a first side and a second side opposite the first side;
   a cross-linked acrylic primer layer adjacent to the second side of the PET layer, the cross-linked acrylic primer layer having a dynamic coefficient of friction ($\mu$D) to steel of less than about 0.45; and
   a metal barrier layer adjacent to the first side of the PET layer,
   wherein the film has a total thickness of less than or equal to about 12 $\mu$m, and a tensile strength of at least about 2500 kg/cm$^2$.

2. The high-barrier film of claim 1, wherein the film has an optical density of greater than about 2.7.

3. The high-barrier film of claim 1, wherein the film has a tensile strength of at least about 2500 kg/cm$^2$ in both a transverse direction and a longitudinal direction of the film.

4. The high-barrier film of claim 1, wherein the cross-linked acrylic primer layer has a cross-linking density of about 10% to about 40%.

5. The high-barrier film of claim 1, wherein the cross-linked acrylic primer layer has a dynamic coefficient of friction ($\mu$D) to steel of less than about 0.45 when heated to 150° C.

6. The high-barrier film of claim 1, wherein the cross-linked acrylic primer layer has a dynamic coefficient of friction ($\mu$D) to steel of less than about 0.20 when heated to 150° C.

7. The high-barrier film of claim 1, wherein the cross-linked acrylic primer layer has a thickness of less than about 0.3 $\mu$m.

8. The high-barrier film of claim 1, wherein the cross-linked acrylic primer layer has a thickness of less than about 0.15 $\mu$m.

9. The high-barrier film of claim 1, wherein the cross-linked acrylic primer layer has a thickness of less than about 0.05 $\mu$m.

10. The high-barrier film of claim 1, wherein the metal barrier layer is comprised of aluminum or aluminum oxide.

11. The high-barrier film of claim 10, wherein the metal barrier layer is comprised of aluminum oxide, and wherein the high-barrier film has an oxygen transmission rate of less than about 1.5 cc/day/m$^2$.

12. The high-barrier film of claim 1, wherein the high-barrier film has an amount of adhesion of the metal barrier layer to the PET layer of greater than about 150 g/inch.

13. The high-barrier film of claim 1, wherein the PET layer comprises a PET homopolymer or a PET copolymer.

14. The high-barrier film of claim 1, wherein the cross-linked acrylic primer layer comprises an acrylate selected from the group consisting of methylmethacrylate, butylacrylate, methacrylic acid, methyl acrylate, acrylic acid, hydroxyethylmethacrylate, and combinations thereof.

15. The high-barrier film of claim 1, wherein the cross-linked acrylic primer layer comprises a cross-linking agent selected from the group consisting of melamines, dicyclocarbodiimides, epoxies, and aldehydes.

16. The high-barrier film of claim 1, wherein the film has a surface roughness of less than about 5 nm.

17. A high-barrier film, comprising:
    a biaxially-oriented polyethylene terephthalate (PET) layer having a first side and a second side opposite the first side;
    a cross-linked acrylic primer layer adjacent to the second side of the PET layer, the cross-linked acrylic primer layer having a dynamic coefficient of friction ($\mu$D) to steel of less than about 0.45; and
    a metal barrier layer adjacent to the first side of the PET layer,
    wherein the film has a total thickness of less than or equal to about 12 $\mu$m, and a surface roughness of less than about 5 nm.

18. The high-barrier film of claim 17, wherein the surface roughness is about 1.5 nm.

19. A high-barrier film, comprising:
    a biaxially-oriented polyethylene terephthalate (PET) layer having a first side and a second side opposite the first side;
    a cross-linked acrylic primer layer adjacent to the second side of the PET layer, the cross-linked acrylic primer layer having a dynamic coefficient of friction ($\mu$D) to steel of less than about 0.45; and
    a metal barrier layer adjacent to the first side of the PET layer,
    wherein the film has a total thickness of less than or equal to about 12 $\mu$m, and an oxygen (O$_2$) transmission rate of less than about 1.0 cc/m$^2$/day.

20. The high-barrier film of claim 19, wherein the oxygen transmission rate is less than about 0.5 cc/m$^2$/day.

21. The high-barrier film of claim 17, wherein the metal barrier layer is comprised of aluminum or aluminum oxide.

* * * * *